United States Patent
Tang

(10) Patent No.: US 7,535,649 B2
(45) Date of Patent: May 19, 2009

(54) MOTIONLESS LENS SYSTEMS AND METHODS

(76) Inventor: Yin S. Tang, 201 Rockview, Irvine, CA (US) 92612

( * ) Notice: Subject to any disclaimer, the term of this patent is extended or adjusted under 35 U.S.C. 154(b) by 634 days.

(21) Appl. No.: 11/146,860

(22) Filed: Jun. 7, 2005

(65) Prior Publication Data

US 2005/0225877 A1 Oct. 13, 2005

Related U.S. Application Data

(63) Continuation-in-part of application No. 10/797,809, filed on Mar. 9, 2004, now Pat. No. 6,940,654.

(51) Int. Cl.
G02B 1/06 (2006.01)
(52) U.S. Cl. ........................ 359/665; 359/666
(58) Field of Classification Search ......... 359/676–706, 359/665, 666; 396/77–79, 379; 348/65
See application file for complete search history.

(56) References Cited

U.S. PATENT DOCUMENTS

| | | | |
|---|---|---|---|
| 4,407,567 A | 10/1983 | Michelet et al. | |
| 5,117,309 A | 5/1992 | Aoki | |
| 5,644,434 A | 7/1997 | Hagimori | |
| 6,111,336 A | 8/2000 | Yoshida et al. | |
| 6,221,687 B1 | 4/2001 | Abramovich | |
| 6,288,767 B1 * | 9/2001 | Murata et al. | 349/200 |
| 6,362,498 B2 | 3/2002 | Abramovich | |
| 6,459,535 B1 | 10/2002 | Goto | |
| 6,535,338 B2 | 3/2003 | Nishikawa | |
| 6,597,509 B2 | 7/2003 | Takakuwa et al. | |
| 6,626,532 B1 | 9/2003 | Nishioka et al. | |
| 6,631,035 B2 | 10/2003 | Iikawa et al. | |
| 6,646,815 B2 | 11/2003 | Nobe | |
| 6,657,795 B2 | 12/2003 | Nishimura et al. | |
| 6,661,584 B2 | 12/2003 | Nishimura | |
| 6,730,459 B2 | 5/2004 | Nishikawa et al. | |
| 6,781,762 B2 | 8/2004 | Ozawa | |
| 6,804,062 B2 | 10/2004 | Atwater et al. | |
| 6,842,289 B2 | 1/2005 | Nishikawa et al. | |
| 6,898,021 B1 | 5/2005 | Tang | |
| 7,265,911 B2 * | 9/2007 | Goosey et al. | 359/676 |
| 7,339,746 B2 * | 3/2008 | Kim et al. | 359/683 |
| 2002/0084251 A1 | 7/2002 | Ricks | |
| 2002/0145701 A1 | 10/2002 | Sun et al. | |

(Continued)

FOREIGN PATENT DOCUMENTS

EP 1 329 432 7/2003

(Continued)

OTHER PUBLICATIONS

Tunable Fresnel Lens Using Nanoscale Polymer-Dispersed Liquid Crystals, by Hongwen Rene et al., Applied Physics Letters, vol. 83, No. 8, Aug. 25, 2003.

(Continued)

*Primary Examiner*—Mohammed Hasan

(57) ABSTRACT

Systems and methods are disclosed herein to provide zoom and/or autofocus lenses. For example, in accordance with an embodiment of the present invention, a lens is provided with at least one tunable lens. The focal length and/or focus of the lens may be varied without mechanically moving or changing the separation between one or more lens components.

39 Claims, 15 Drawing Sheets

U.S. PATENT DOCUMENTS

2005/0103745 A1    5/2005    Li
2006/0073623 A1    4/2006    Conley, Jr. et al.

FOREIGN PATENT DOCUMENTS

JP           13-272646       3/2000
JP           2001-272646       5/2001
WO      WO 2005/91784       10/2005

OTHER PUBLICATIONS

Tunable Liquid-Filled Microlens Array Integrated With Microfluidic Network, by Nikolas Chronis et al., Optics Express, vol. 11, No. 19, Sep. 22, 2003.

Microlenses Immersed In Nematic Liquid Crystal With Electrically Controllable Focal Length, by L. G. Commander et al., EOS Topical Digest Meetings Microlens Arrays, vol. 5, 1995, pp. 72-76.

\* cited by examiner

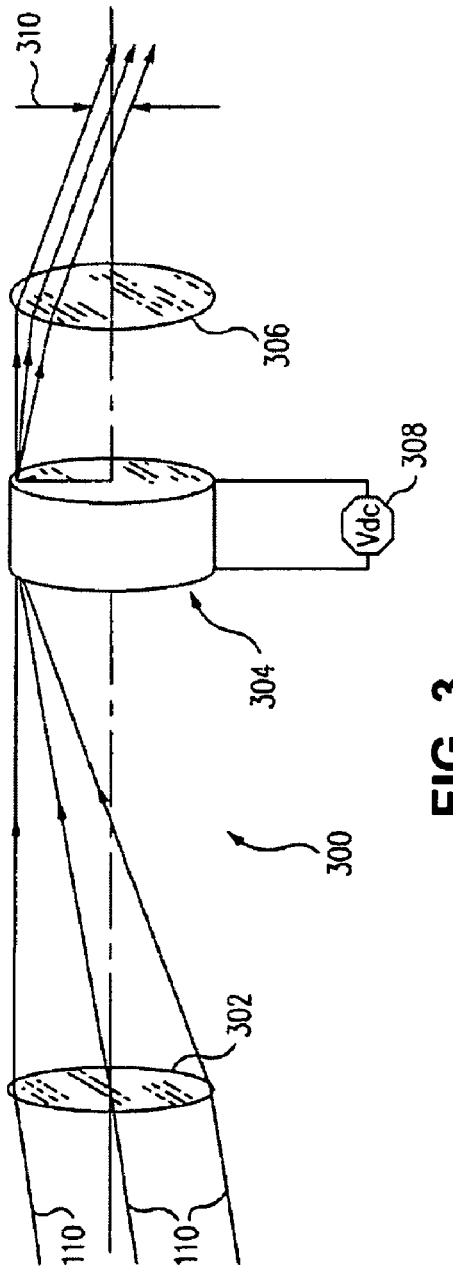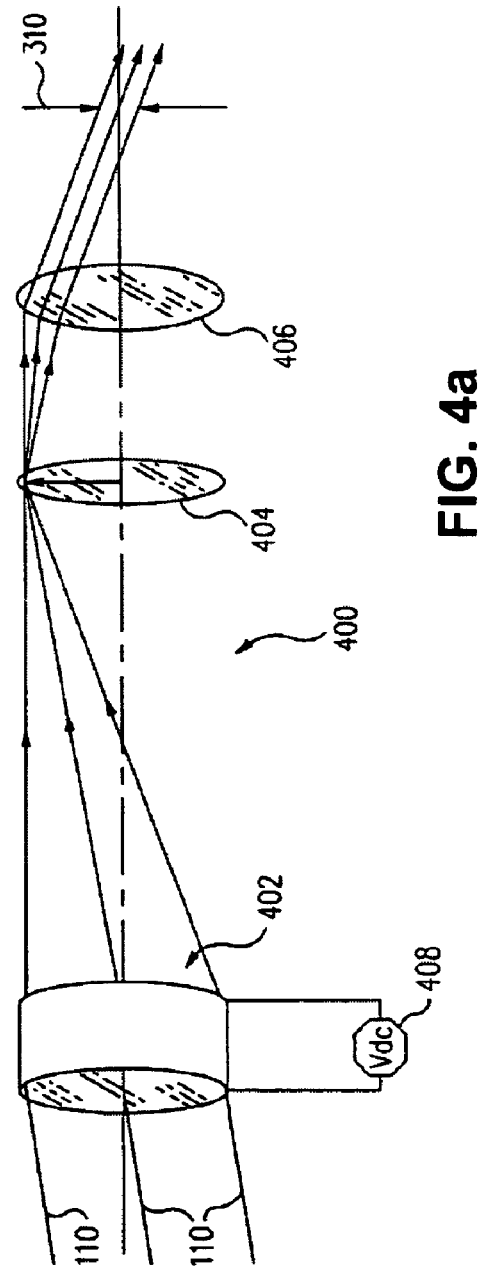

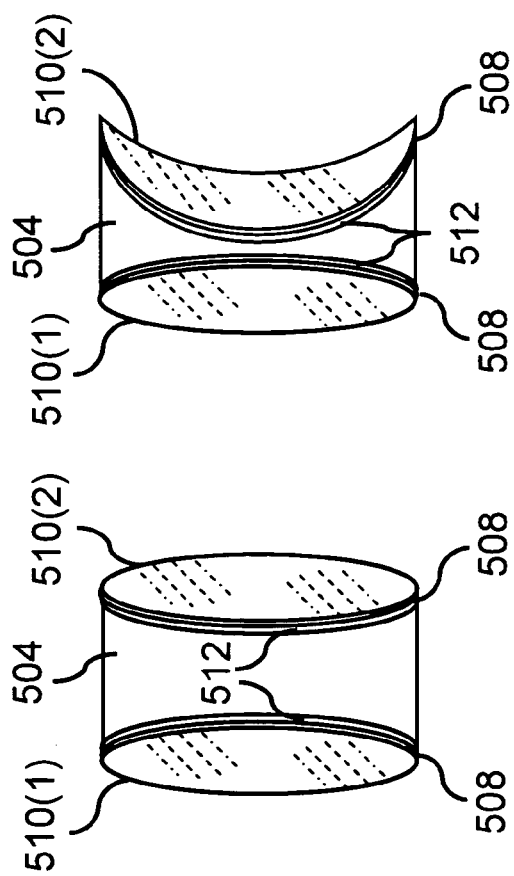
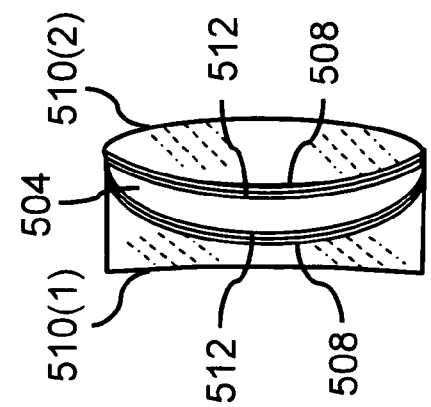
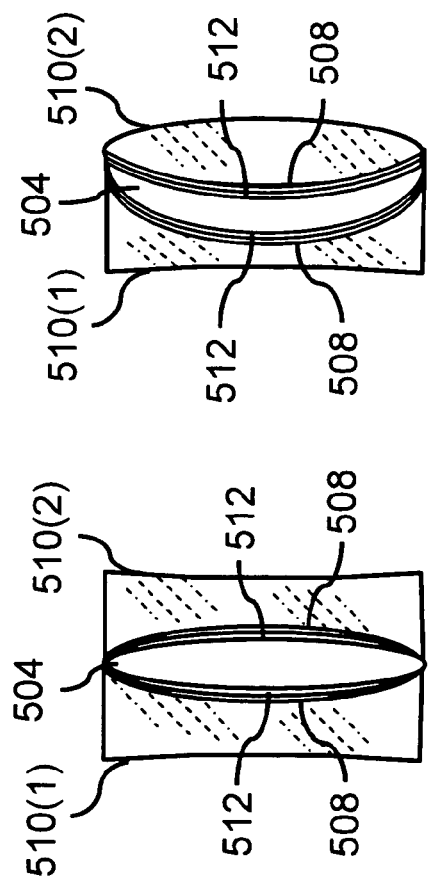

MOTIONLESS LENS SYSTEMS AND METHODS

CROSS-REFERENCE TO RELATED APPLICATIONS

This application is a continuation-in-part of U.S. patent application Ser. No. 10/797,809 entitled "Lens Array and Method of Making Same" and filed Mar. 9, 2004, now U.S. Pat. No. 6,940,654 which is incorporated herein by reference in its entirety.

TECHNICAL FIELD

The present invention relates generally to optical devices and, more particularly, to lenses, such as for zoom and autofocus applications.

BACKGROUND

Zoom and autofocus lens functions are well known and employed in a variety of applications. For example, a conventional zoom lens (i.e., any type of lens having a variable focal length) may include at least two lens components whose shape and spacing determine the focal length of the zoom lens. As an example, a mechanically compensated zoom lens for a camera may generally arrange the motion of the two components so that an image location or image plane remains constant. As another example, a zoom lens may have an objective lens, an image lens (also called an eye lens), and a field lens between the objective lens and the image lens. By moving the field lens and possibly the objective lens, the focal length of the zoom lens is varied.

One drawback of conventional zoom lenses is that they are often large and heavy, which makes it difficult to incorporate the zoom lens into a small device (e.g., a portable phone, a personal digital assistant (PDA), or a compact camera). Another drawback generally of conventional zoom lenses and also of autofocus lenses is that one or more of the lens components must be moved (e.g., mechanically repositioned within the lens group) to vary the focal length, which generally requires space and power to accommodate the movement. As an example, with the development and rapid market introduction of small cameras for cellular telephones, PDAs, and compact digital cameras, which typically have strict power requirements and are limited by their battery's capabilities, there is a clear need for an improved lens for providing zoom and/or autofocus functionality.

SUMMARY

Systems and methods are disclosed herein to provide lenses for zoom and/or autofocus applications. For example, in accordance with an embodiment of the present invention, a lens is provided having one or more tunable lens elements to provide zoom and/or autofocus. By varying a voltage level applied to a tunable lens element, a focal length of the zoom lens is varied or the focus of the lens is varied. Therefore, the focal length of the zoom lens or the focus of the autofocus lens may be varied without mechanically moving its lens components. Consequently, the lens may offer certain advantages over a conventional lens, such as for example having lower power requirements, no mechanical driving mechanism, able to be manufactured in a smaller, lighter, and more compact form, and/or capable of withstanding shocks (e.g., due to the lens or device that incorporates the lens being dropped or due to other forces).

More specifically, in accordance with one embodiment of the present invention, a lens includes a first lens comprised of a nematic liquid crystal and adapted to provide a variable index of refraction; and a second and a third lens, wherein the first lens, the second lens, and the third lens are situated in fixed positions to provide a focal length for the lens, with a variable focus based on the index of refraction of the first lens.

In accordance with another embodiment of the present invention, a lens includes a first lens adapted to provide a variable index of refraction; and a second lens, wherein the first lens and the second lens are situated in fixed positions to provide a focal length for the lens, with a variable focus based on the index of refraction of the first lens, and wherein the focus is varied by rotating the first lens, which varies the index of refraction of the first lens.

In accordance with another embodiment of the present invention, an optical device includes a first lens having a variable index of refraction; a second lens and a third lens situated in fixed positions relative to the first lens such that light passes through the first lens, the second lens, and the third lens of the optical device; and means for varying the index of refraction of the first lens to vary a focus of the optical device.

In accordance with another embodiment of the present invention, a method of varying a focus of a motionless lens includes providing a first lens having a variable index of refraction; providing at least a second lens disposed at a corresponding fixed distance from the first lens; and varying the index of refraction of the first lens to adjust the focus of the motionless lens.

In accordance with another embodiment of the present invention, a method of making a lens includes providing a substrate; depositing a dielectric layer over the substrate; depositing a patterning layer over the dielectric layer; removing a portion of the patterning layer to form a lens shape; and removing a portion of the dielectric layer based on the lens shape to form a lens template.

In accordance with another embodiment of the present invention, a method of making a lens includes providing a substrate; depositing a patterning layer over the substrate; removing a portion of the patterning layer to form a lens shape; and transferring the lens shape to one or more layers below the patterning layer to form a lens template.

In accordance with another embodiment of the present invention, a lens includes a nematic liquid crystal and adapted to provide a variable index of refraction; at least one conductor, coupled to the nematic liquid crystal, adapted to provide a voltage to the nematic liquid crystal; at least one substrate coupled to the nematic liquid crystal; and at least one layer of an initial liquid crystal molecular alignment assistant material disposed between the nematic liquid crystal and the at least one substrate.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 3 illustrates a variable focus lens in accordance with an embodiment of the present invention.

FIG. 4a illustrates a zoom lens in accordance with an embodiment of the present invention.

FIGS. 5c through 5f illustrate side views of exemplary implementations of a tunable lens in accordance with one or more embodiments of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
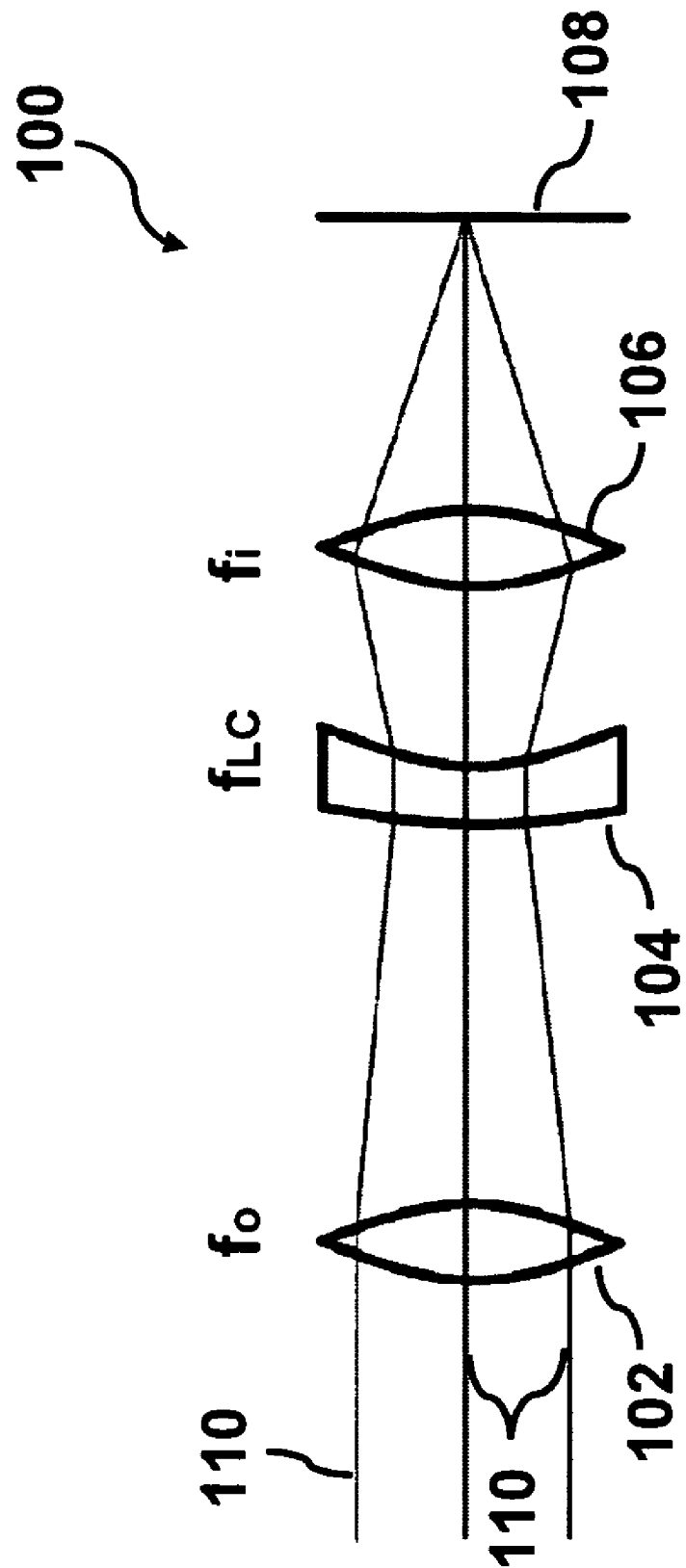
FIG. 1 illustrates a variable focus lens in accordance with an embodiment of the present invention.

FIG. 1 illustrates a lens 100 in accordance with an embodiment of the present invention. Lens 100 includes an objective lens 102, a tunable field lens 104, and an imaging lens 106. Objective lens 102 (labeled $f_o$) and imaging lens 106 (labeled $f_i$) may represent a conventional objective lens and a conventional image lens (also referred to as an imaging lens or an eye lens), respectively, and may be made of glass, plastic, or other known conventional lens materials.

Imaging lens 106 may be located separate from, adjacent to, or formed as part of tunable field lens 104 (labeled $f_{LC}$) as a tunable lens set. Tunable field lens 104, as described in further detail herein, is a lens whose index of refraction may be varied, such as for example by the application of a voltage to tunable field lens 104. By varying the index of refraction of tunable field lens 104, a focal length or focus of lens 100 may be varied.

As illustrated in FIG. 1 as an example, objective lens 102, tunable field lens 104, and imaging lens 106 function, for example, to direct (e.g., magnify) and/or focus light 110 onto an image plane 108. For example, a user may vary the index of refraction of tunable field lens 104 to change the focal length (which may also be referred to as zoom, autofocus, magnification, power, or field of view, depending upon the application) of lens 100 (e.g., as a zoom lens and/or an autofocus lens). In contrast, a conventional lens (e.g., zoom lens or autofocus lens) would generally require one or more of its lens components to be physically moved or repositioned to provide a different focal length or focus.

For example, because lens 100 does not require its lens components (e.g., objective lens 102, tunable field lens 104, and/or imaging lens 106) to move or be mechanically repositioned to adjust its focal length, lens 100 (along with one or more other embodiments discussed herein) may offer certain advantages over conventional lenses. For example, lens 100 may provide a motionless, compact zoom lens or autofocus lens for portable devices (e.g., camera, cellular telephone, or PDA). Furthermore, lens 100 may be designed to be compact (e.g., a total track length of the lens system as short as one centimeter or less), while still offering, for example, a wide viewing angle and a variable focal length.

Figure 2:
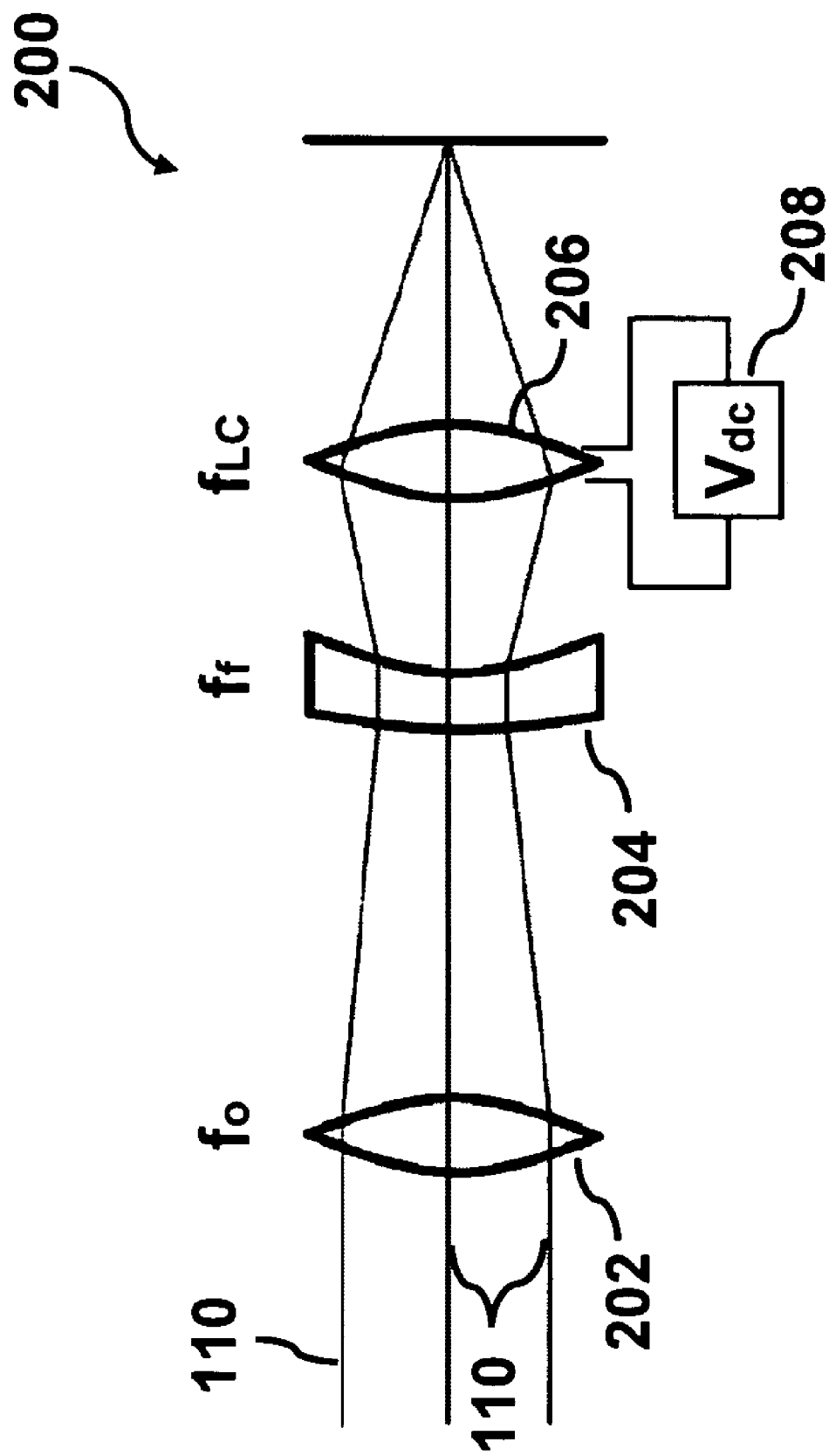
FIG. 2 illustrates a variable focus lens in accordance with an embodiment of the present invention.

Lens 100 illustrates an exemplary configuration of lens components, but this configuration is not limiting and it should be understood that the principles of the present invention are applicable to a wide variety of lens configurations and applications for a tunable lens. For example, FIG. 2 illustrates a lens 200 in accordance with an embodiment of the present invention. Lens 200 includes an objective lens 202, a field lens 204, and a tunable eye lens 206. Objective lens 202 and field lens 204 each can be either a conventional lens (e.g., made of glass, plastic, or other known conventional lens materials) or a tunable lens. Lens 200 can be configured to perform an autofocus function if field lens 204 is a conventional lens. Alternatively, lens 200 can be configured to perform both zoom and autofocus functionalities if objective lens 202 and/or field lens 204 is another tunable lens, which may be independently controlled.

Eye lens 206 is a tunable lens, which, for example, may be tuned by varying a voltage 208 applied to eye lens 206, as discussed in further detail herein (e.g., in reference to FIGS. 5a-5f). By varying a voltage level of voltage 208, eye lens 206 varies the amount of deflection applied to light 110 (e.g., the index of refraction of eye lens 206 is varied) and, consequently, the adjustment of autofocus lens 200.

In addition to eye lens 206 being a tunable lens, if field lens 204 is also a tunable lens (e.g., tuned by varying a voltage applied to field lens 204 in a similar fashion as described for eye lens 206), lens 200 may also provide zoom functionality. For example, by applying an independent voltage level to tunable field lens 204, the amount of deflection applied to light 110 is varied (e.g., the index of refraction of field lens 204 is varied). Consequently, lens 200 may provide zoom and autofocus functionality by independently varying the index of refraction (e.g., focal lengths) of field lens 204 and eye lens 206.

As another example, FIG. 3 illustrates a lens 300 in accordance with an embodiment of the present invention. Lens 300 includes an objective lens 302, a field lens 304, and an eye lens 306. Field lens 304 is a tunable field lens, which is tuned for example by varying a voltage level of a voltage 308 applied to field lens 304. Objective lens 302, field lens 304, and eye lens 306 may be implemented, for example, to function as a motionless zoom lens to provide a variable focal length or as an autofocus lens to vary the focus and direct light 110 onto an image plane 310.

Field lens 304 may be implemented, for example, as a liquid-crystal filled lens whose power can be either positive or negative, and is tunable by a voltage level of voltage 308 (i.e., an external bias to field lens 304). By tuning the power of field lens 304, the effective refractive index of field lens 304 is varied and, consequently, the focal length or focus of lens 300 is varied.

As another example, FIG. 4a illustrates a zoom lens 400 in accordance with an embodiment of the present invention. Zoom lens 400 includes an objective lens 402, a field lens 404, and an eye lens 406. Zoom lens 400 is similar to lens 300 (FIG. 3), but zoom lens 400 provides a tunable objective lens 402 rather than tunable field lens 304 (FIG. 3).

Objective lens 402 is tunable by the application of a voltage 408, with an index of refraction of objective lens 402 varied as a voltage level of voltage 408 is varied. Objective lens 402, field lens 404, and eye lens 406 may be implemented, for example, to function as a motionless zoom lens to provide a variable focal length and direct light 110 onto image plane 310.

Figure 4B:
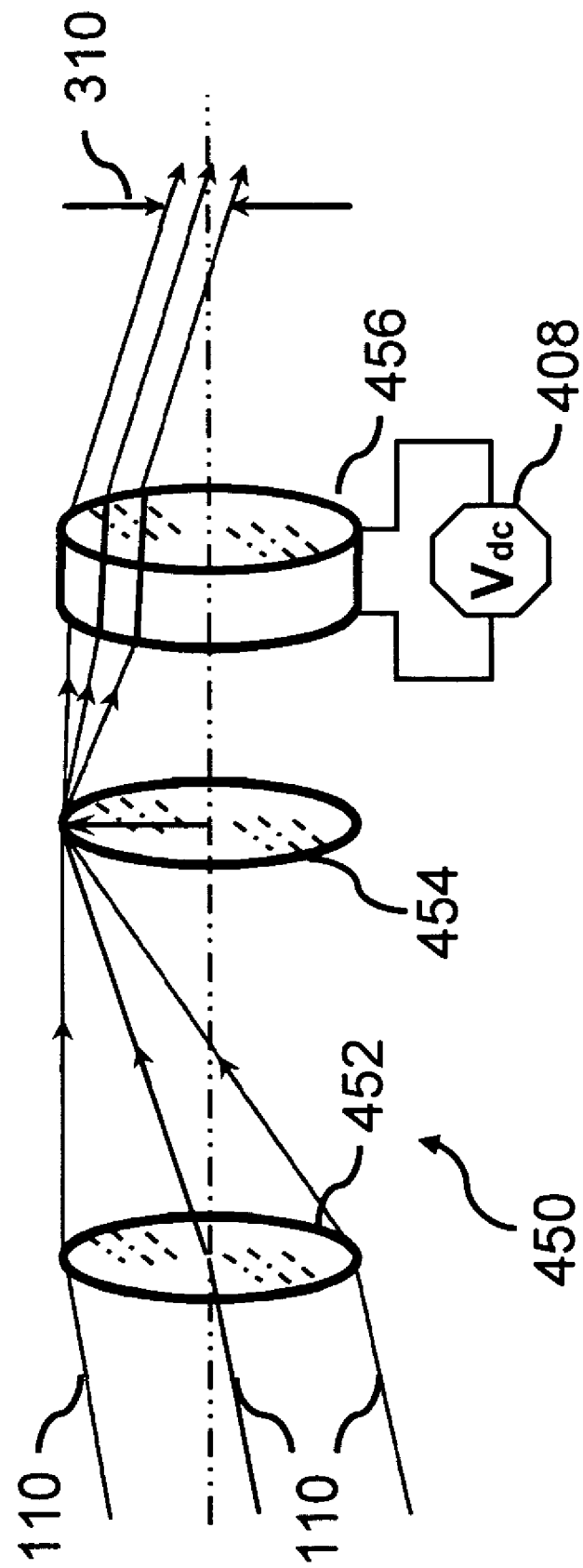
FIG. 4b illustrates an autofocus lens in accordance with an embodiment of the present invention.

In a similar fashion, FIG. 4b illustrates an autofocus lens 450 in accordance with an embodiment of the present invention. Autofocus lens 450 includes an objective lens 452, a field lens 454, and an eye lens 456. Autofocus lens 450 is similar to lens 300 (FIG. 3), but autofocus lens 450 provides a tunable eye lens 456 rather than tunable field lens 304.

Eye lens 456 is tunable by the application of a voltage 408, as described similarly for objective lens 402 (FIG. 4a). Objective lens 452, field lens 454, and eye lens 456 may be implemented, for example, to function as a motionless autofocus lens to provide a variable focus and direct light 110 onto image plane 310.

In general, similar to a zoom lens, an autofocus lens system may include a tunable field lens between an objective lens and an eye lens. Alternatively, an autofocus lens system may provide a tunable eye lens along with a field lens and the objective lens. Furthermore, if a lens system includes the objective lens along with a tunable field lens and a tunable eye lens, the lens system may provide both zoom and autofocus by controlling the tunable field lens and the tunable eye lens, respectively. Consequently, as disclosed herein and as would be understood by one skilled in the art, by providing various combinations of tunable objective, field, and/or eye lens components, a lens system may be provided that offers zoom, autofocus, or a combination of zoom and autofocus features.

Figure 5A:
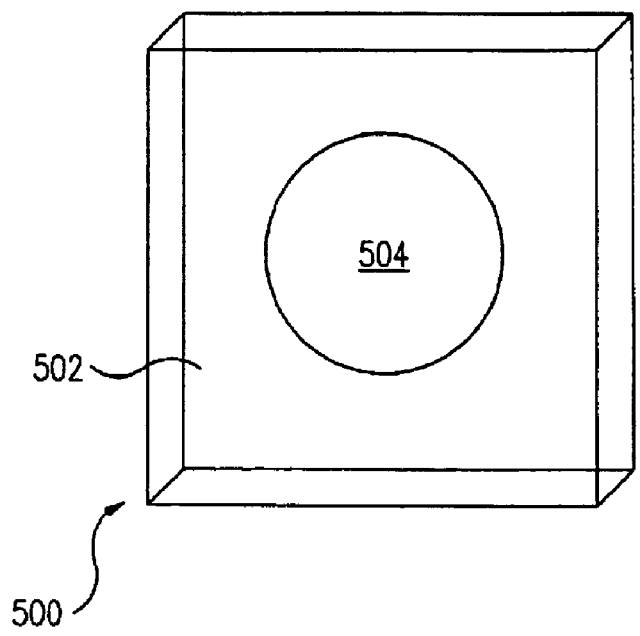
FIGS. 5a and 5b illustrate a top perspective view and a side view of a tunable lens in accordance with an embodiment of the present invention.
Figure 5B:
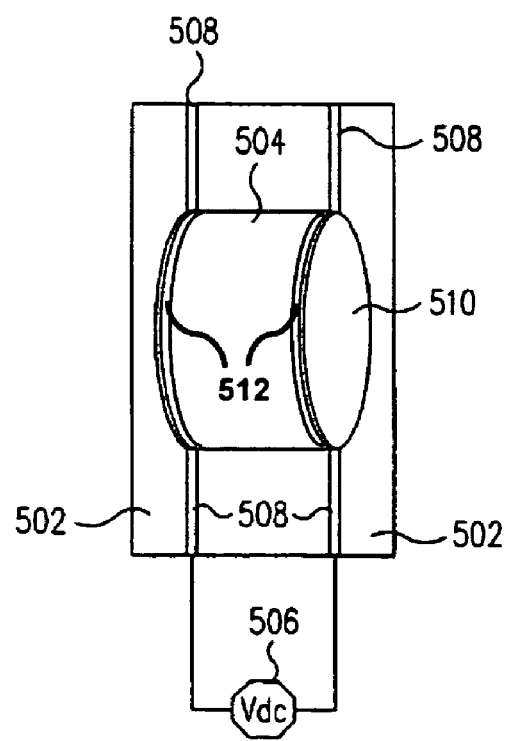

FIGS. 5a and 5b illustrate a top perspective view and a side view of a tunable lens 500 in accordance with an embodiment of the present invention. Tunable lens 500 includes a substrate 502 and a lens 504. Substrate 502 may be made, for example, of glass or plastic or other desired material to support lens 504.

Lens 504 may be made, for example, of nematic liquid crystal (e.g., pure nematic or twisted nematic liquid crystal and the like) as known by one skilled in the art. Lens 504 made from liquid crystal may provide a low cost tunable lens that may be manufactured using conventional-semiconductor processing techniques. One or more conductors 508 (e.g., a transparent conductor such as indium tin oxide (ITO)) may be included in tunable lens 500 to allow an external bias 506 (e.g., a variable voltage source) to be applied to lens 504. In addition, a layer 512 of initial liquid crystal molecular alignment assistant material may be applied. Layer 512 (e.g., a dielectric, such as a polymer, on one or both sides of lens 504) may be directionally rubbed, ion beam irradiated, or UV light activated as would be understood by one skilled ion the art.

As an example, in accordance with an embodiment of the present invention, under an external direct current (DC) bias, the nematic liquid crystal molecules realign to the electric field to effectively change the refractive index of the lens material of lens 504 and, thus, change the focal length or focus of tunable lens 500 (e.g., to provide a zoom and/or autofocus function for a lens that incorporates one or more tunable lenses 500). Consequently, for example, by varying a voltage level of external bias 506, the index of refraction of lens 504 is varied, which varies the focal length of a zoom lens or focus of an autofocus lens employing tunable lens 500.

As an example, in accordance with an embodiment of the present invention, layer 512 (e.g., a thin transparent material, which helps the initial alignment of the liquid crystal molecules) may be applied to either side or both sides of tunable lens 504. This layer 512 of initial liquid crystal molecular alignment assistant material, for example, may be a dielectric (e.g., a polymer), which may be directionally rubbed, ion beam irradiated, or UV light activated as would be understood by one skilled in the art.

Furthermore, in accordance with an embodiment of the present invention, rather than varying a voltage via external bias 506 to lens 504, a different type of energy source may be employed to cause lens 504 to vary the index of refraction of lens 504. For example, a heat or energy source (e.g., a laser, a heater element, or an energy beam) may be utilized to vary the index of refraction of lens 504.

Tunable lens 500 may also include a lens 510 (e.g., a fixed focal lens). Lens 510 may be incorporated into tunable lens 500 as an integral part of tunable lens 500. For example, lens 510 may be formed by diffusion, deposition, spin-on polymers through lithographic patterning, or other techniques as would be known by one skilled in the art.

Tunable lens 500 may include lens 510 on one or both sides of lens 504, with lens 510 having various configurations or shapes. For example, FIGS. 5c through 5f illustrate side views of exemplary implementations of tunable lens 500 with exemplary lenses 510 in accordance with one or more embodiments of the present invention. As illustrated in FIGS. 5c through 5f, lens 504 may be situated (e.g., sandwiched) between lenses 510, which are separately referenced as lens 510(1) and lens 510(2).

As discussed herein, for example, external bias 506 may be applied to lens 504 via transparent electrodes 508 (e.g., ITO) on both sides of the tunable liquid crystal lens 504 to change the refractive index of lens 504. The transparent electrodes 508, for example, may be formed on the internal and/or external surfaces of lens 510(1) and lens 510(2). Additionally, layer 512 of initial liquid crystal molecular alignment assistant material may be applied, and layer 512 (e.g., a dielectric, such as a polymer, on one or both sides of lens 504) may be directionally rubbed, ion beam irradiated, or UV light activated as would be understood by one skilled ion the art.

Lenses 510(1) and 510(2), for example, may represent traditional lenses that may be independently shaped or formed, as desired depending upon the specific application, functions, or requirements. For example, lenses 510 (1) and 510(2) may have convex, concave, or confocal lens shapes or any other shape or desired combination of shapes in order to perform a specific function or have specific and designed characteristics. Lenses 510 may be made utilizing conventional techniques (e.g., polishing or glass or plastic molding using suitable glass or plastic materials) or may be made using various techniques disclosed herein in accordance with one or more embodiments of the present invention.

In accordance with one or more embodiments of the present invention, field lens 104, field lens 204, eye lens 206, field lens 304, objective lens 402, and/or eye lens 456 may be implemented as described for tunable lens 500. Furthermore, for example, if tunable lens 500 includes lens 510, then tunable lens 500 may be substituted for the combination of tunable field lens 104 and imaging lens 106 of FIG. 1 (i.e., lens 504 and lens 510 of lens 500 replacing tunable field lens 104 and imaging lens 106, respectively). Thus, techniques discussed for making tunable lens 500 may be applied to tunable lenses described herein (e.g., in reference to FIGS. 1-4) to provide positive and/or negative lenses having tunable focal lengths or focus properties.

For example, a zoom lens incorporating a tunable lens as described herein, in accordance with an embodiment of the present invention, may provide for example a varying amount of magnification (e.g., variable magnification up to three times or more). The effective focal length may for example be controlled by an external bias, which may vary from one volt to twenty volts or more, depending upon the selection of specific liquid crystals, desired application or magnification requirements (e.g., to provide an electro-optical zoom lens).

As another example, an autofocus lens incorporating a tunable lens as described herein, in accordance with an embodiment of the present invention, may provide for example a varying amount of focus. The focus may be varied and controlled, as discussed further herein, by utilizing feedback based on an image quality to improve the focus and potentially optimize the image quality. The focus may for example be controlled by an external bias, which may vary from one volt to twenty volts or more, depending upon the selection of specific liquid crystals, desired application or autofocus requirements (e.g., to provide an electro-optical autofocus lens based on variable focal length and/or image quality feedback adjustments).

In accordance with an embodiment of the present invention, a motionless zoom and/or autofocus lens is provided which incorporates one or more tunable lenses within its lens components. For example, the zoom lens may provide an optical system having a continuously variable focal length, but this is not limiting. As an example, the image plane may remain in a fixed position or may require refocusing at each incremental focal length (e.g., as with vari-focal lenses).

For the autofocus lens, as an example, an optical system may be provided having a continuously variable focus. For example, a tunable lens may be provided as disclosed herein (e.g., in the objective, field, or eye lens position of a lens group) to provide autofocus functionality. Furthermore, one or more additional tunable lenses may be provided within the lens system to provide zoom functionality in addition to autofocus functionality.

Figure 7:
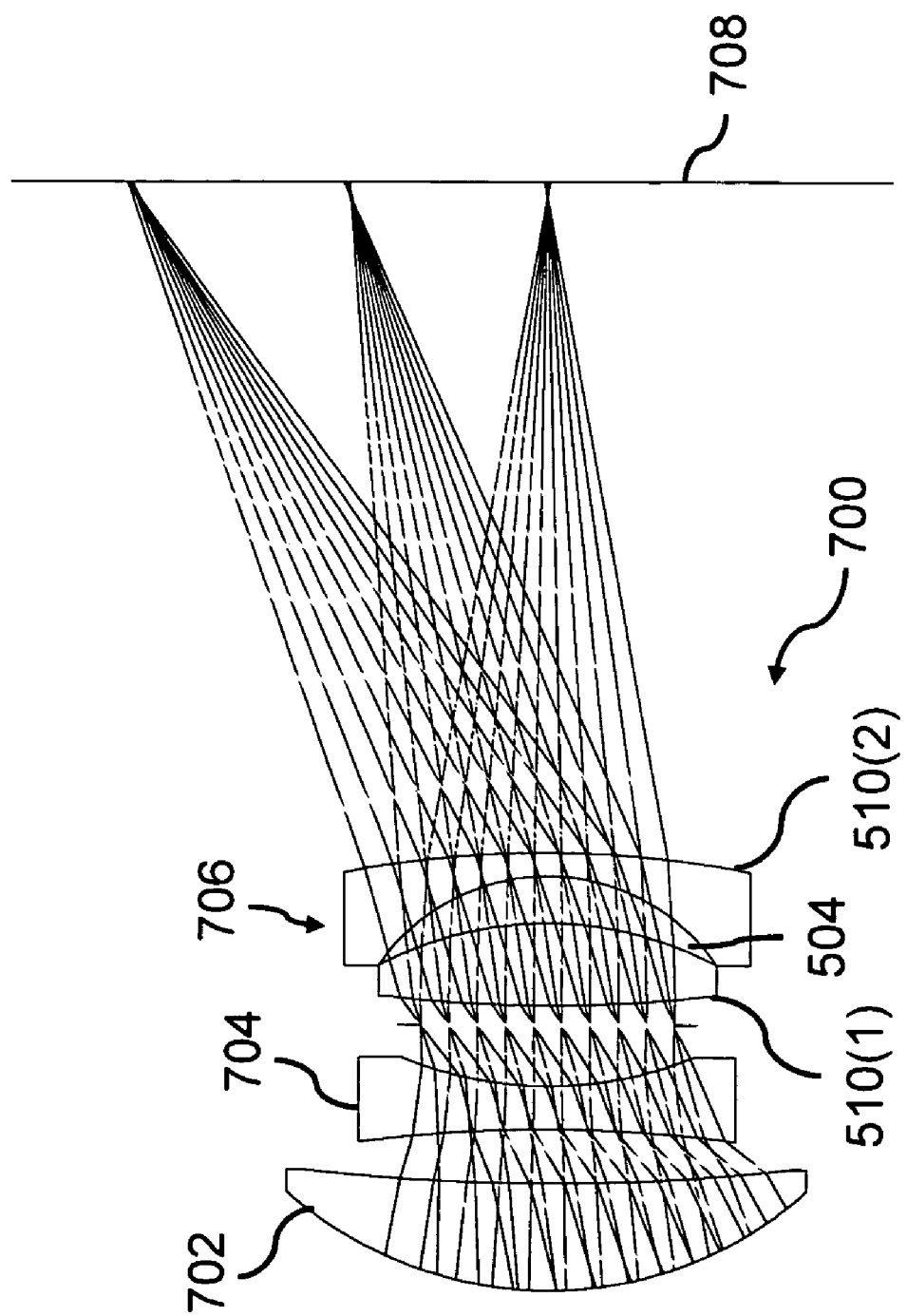
FIG. 7 illustrates an autofocus lens in accordance with an embodiment of the present invention.
Figure 8:
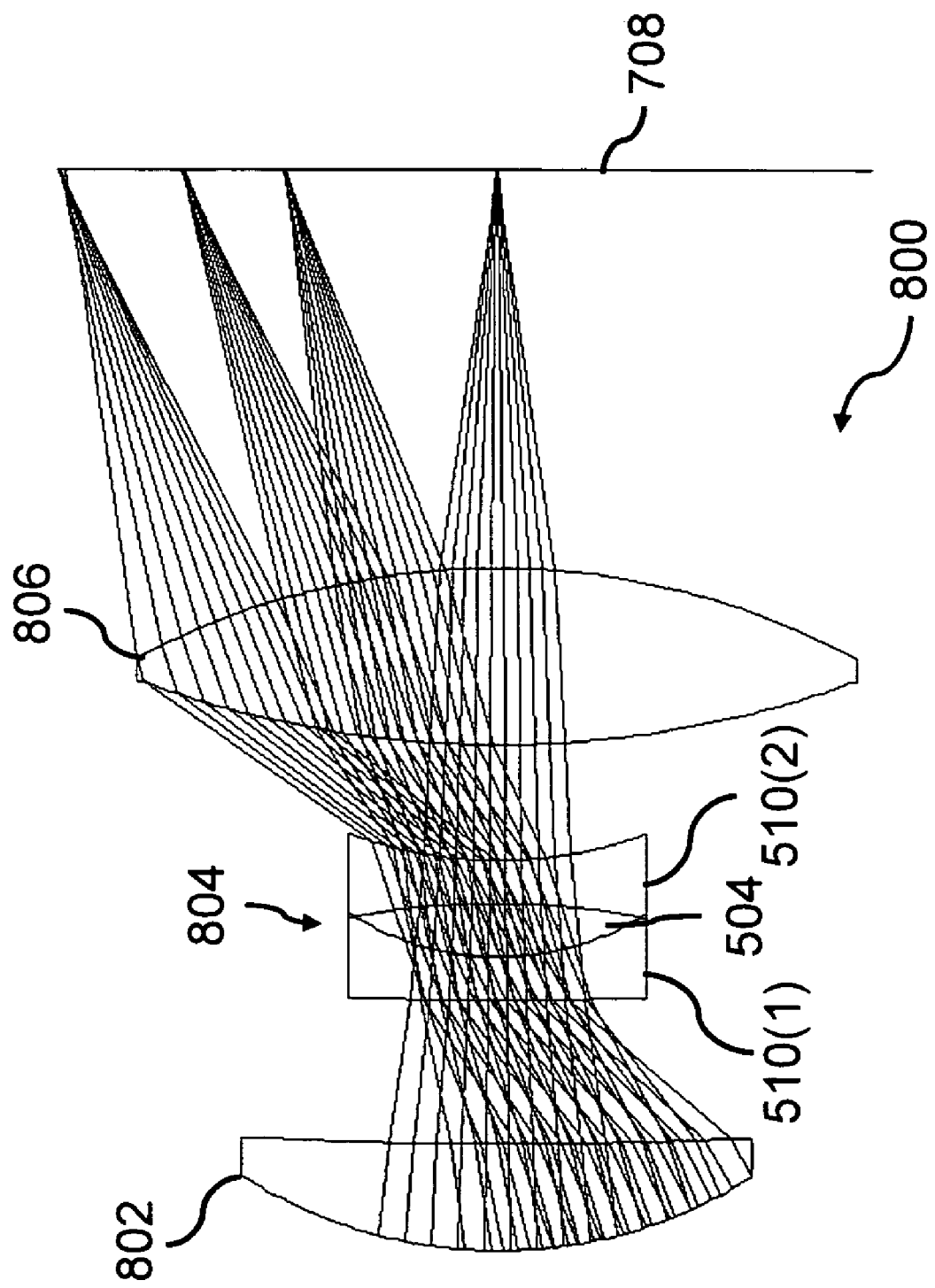
FIG. 8 illustrates an autofocus lens in accordance with an embodiment of the present invention.
Figure 9:
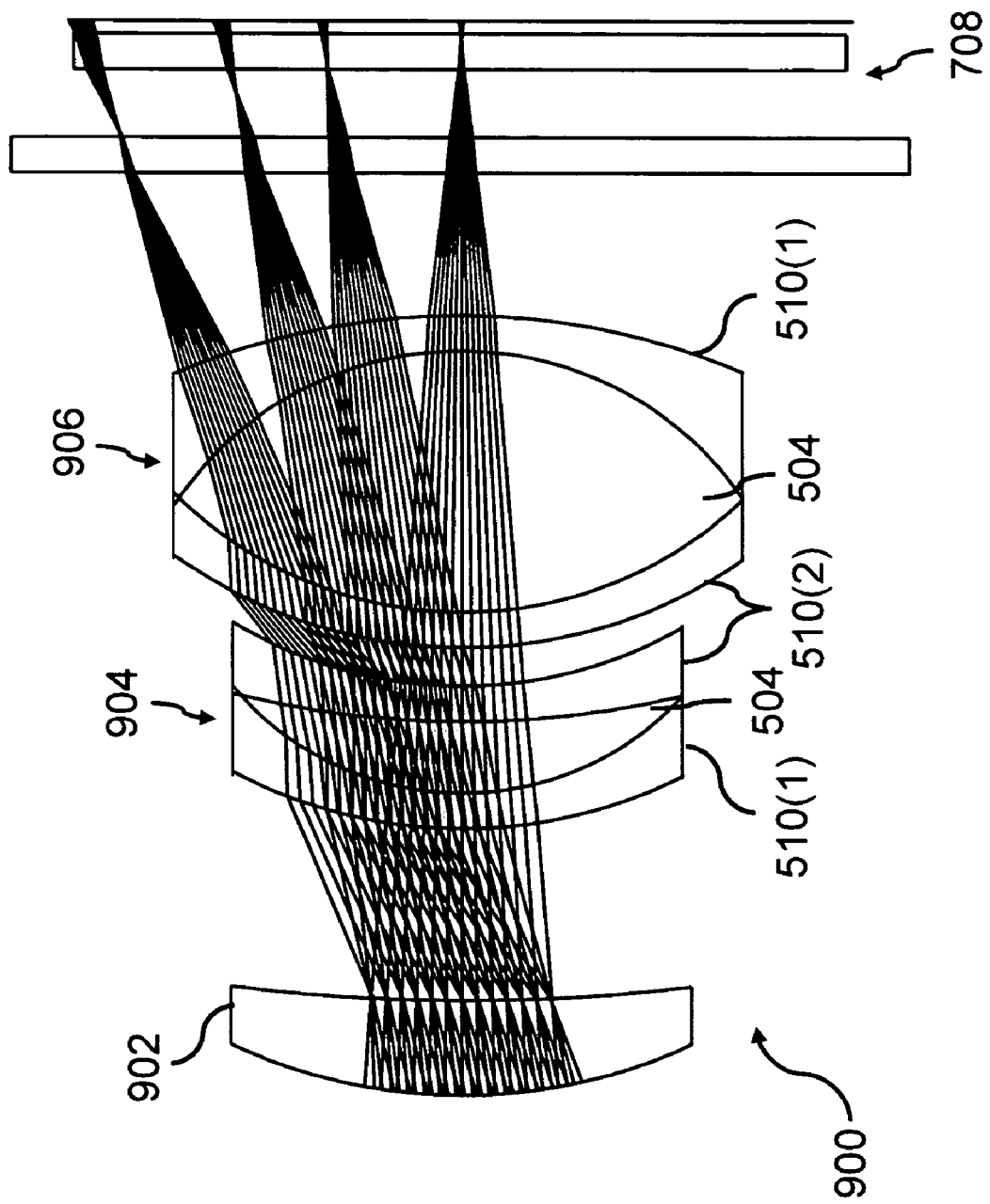
FIG. 9 illustrates a zoom lens with autofocus functionality in accordance with an embodiment of the present invention.

For example, referring briefly to FIGS. 7-9, exemplary lens implementations are shown in accordance with one or more embodiments of the present invention. Specifically, FIGS. 7-9 illustrate lenses 700, 800, and 900, respectively.

Lens 700 includes an objective lens 702, a field lens 704, and an eye lens 706. Eye lens 706 may be implemented as a tunable lens (e.g., as described for tunable lens 500) having lens 504 and lenses 510(1) and 510(2). Exemplary light rays are shown passing through lens 700 to an image plane 708.

Lens 800 includes an objective lens 802, a field lens 804, and an eye lens 806, with field lens 804 implemented as a tunable lens (e.g., as described for tunable lens 500). Lens 900 includes an objective lens 902, a field lens 904, and an eye lens 906. Field lens 904 and eye lens 906 may each be implemented as a tunable lens (e.g., as described for tunable lens 500). Consequently, lens 900 may provide zoom and autofocus capability, with for example field lens 904 controlled to provide the zoom function and eye lens 906 controlled to provide the autofocus function. Image plane 708, as shown in FIG. 9, may also include a protective glass or plastic (e.g., in front of a sensor (not shown)), which may also provide filtering (e.g., color filtering or infrared filtering) depending upon the application or specific requirements.

In general, in accordance with an embodiment of the present invention, a motionless zoom and/or autofocus lens is provided which is based on controlling or varying an effective index of refraction of one or more of its lens components. Consequently, no mechanical motion or physical repositioning of one or more lens components within the lens is required.

The tunable lens, in accordance with an embodiment of the present invention, may be provided as a liquid crystal-based tunable lens. However, a liquid crystal-based tunable lens is not limiting and the tunable lens may be implemented by other types of materials whose effective refractive index is variable. For example, a piezoelectric material or a non-linear optical axis dependent birefringence material may be employed along with suitable corresponding techniques for controlling the change of effective refractive index of the selected lens material.

For example, a variable focal lens may be made of a non-linear optical material, with the focal length of the zoom lens incorporating the variable focal lens controlled by turning the non-linear optical material from one optical axis to another without physically pushing, pulling, or sliding the variable focal lens along the direction of magnification (i.e., the variable focal lens is not moved toward or away from the other lens components as in a conventional zoom lens). In a similar fashion, for example, a focus of the autofocus lens incorporating a variable focal lens is controlled by turning the non-linear optical material from one optical axis to another.

For example, in accordance with an embodiment of the present invention, rather than implement tunable lens 500 within a zoom and/or autofocus lens, one or more tunable lenses may be implemented within the zoom and/or autofocus lens by utilizing an optical non-linear material having a variable refractive index. As an example, the tunable lens may incorporate a piezoelectric material or a non-linear optical crystal. The non-linear optical crystal (e.g., a crystal 602 as described in reference to FIG. 6) will have a different index of refraction along different optical axes (e.g., an "X", a "Y", and/or a "Z" axis of crystal 602). The variation of the index of refraction can be controlled, for example, by turning the non-linear optical crystal from one optical axis to another.

Figure 6:
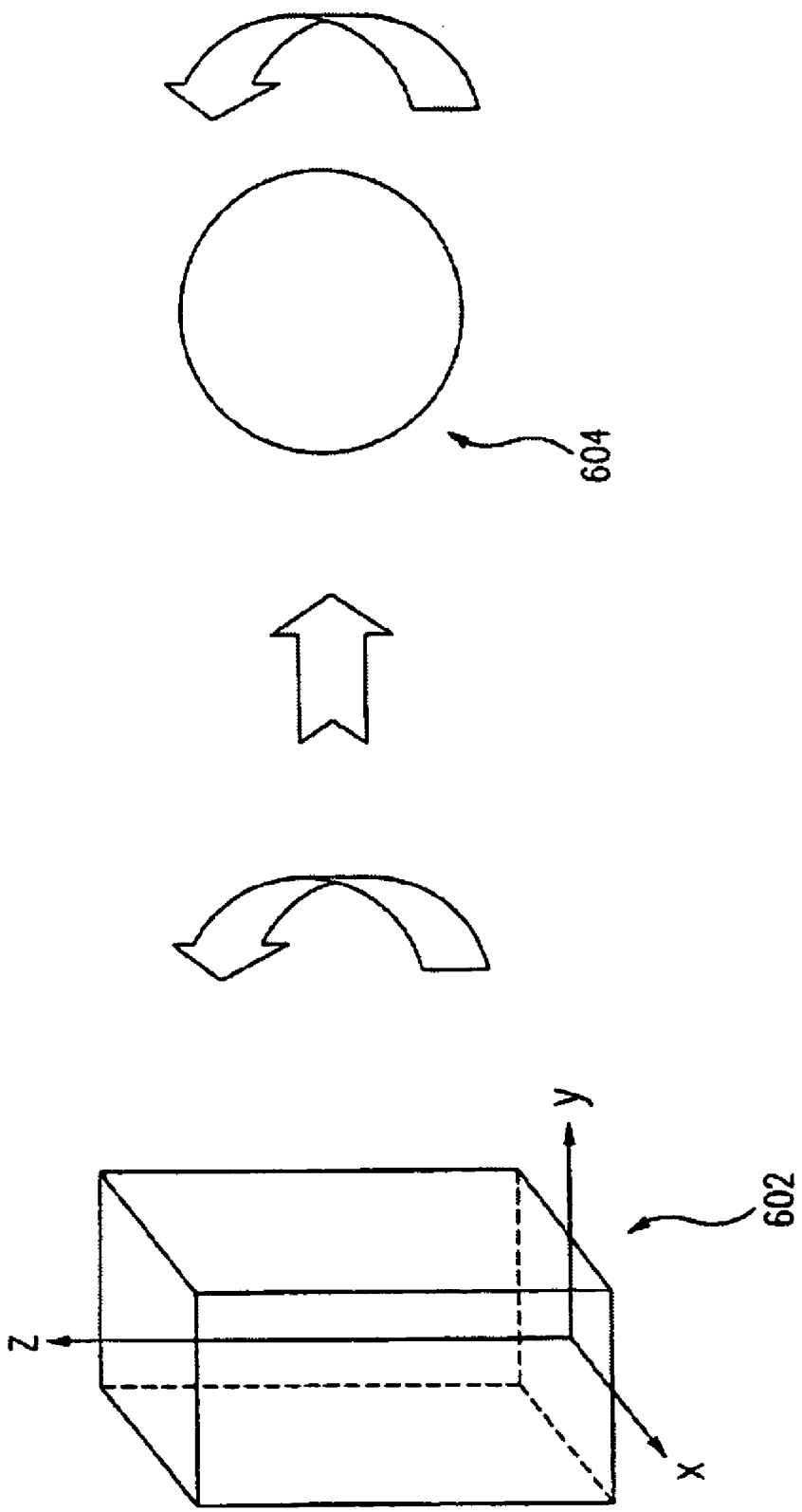
FIG. 6 illustrates a non-linear crystal and a tunable lens in accordance with an embodiment of the present invention.

For example, FIG. 6 illustrates a representation of a non-linear optical crystal 602 and a tunable lens 604 in accordance with an embodiment of the present invention. Tunable lens 604 may be made of a non-linear optical crystal (e.g., such as crystal 602) that has a different index of refraction along one or more of its axes (i.e., as with crystal 602). For example, tunable lens 604 may be rotated (e.g., as illustrated in FIG. 6) to change the index of refraction and, consequently, the magnification of a zoom lens incorporating tunable lens 604. As an example, tunable lens 604 may be rotated from the X axis to the Y axis or from the X or Y axis to the Z axis to provide an incremental or continuously variable index of refraction (e.g., to provide zoom and/or autofocus functionality).

Tunable lens 604 may be placed in any lens position to provide a varying index of refraction. For example, tunable lens 604 may be substituted for field lens 104, field lens 204, eye lens 206, field lens 304, objective lens 402, or eye lens 456 in corresponding FIGS. 1 through 4b (i.e., to provide lens 100, lens 200, lens 30', lens 400, or lens 450). Thus, tunable lens 604 would be rotated to provide a different index of refraction, rather than varying a voltage bias as described herein. In general, rotating tunable lens 604 to provide a different index of refraction may offer certain advantages (e.g., in terms of size or weight) over conventional techniques of mechanically moving lens components back and forth to vary a separation distance between lens components.

Crystal 602, as illustrated in an exemplary fashion in FIG. 6, may be shaped, cut, or formed to a shape similar to tunable lens 604 (e.g., a ball lens). Tunable lens 604 may be, for example, a KDP crystal, a KTP crystal, a $\beta$-B$_a$B$_2$O$_2$ crystal, an L$_i$B$_3$O$_5$ crystal or any other type of non-linear optical crystal as known by one skilled in the art. For example, the KDP crystal may have an index of refraction of $n_o$=1.4938 (e.g., for the z axis) and $n_e$=1.4599 (e.g., for the x or y axis), the KTP crystal may have an index of refraction of $n_{z=c}$=1.8305, $n_{x=a}$=1.7395, and $n_{y=b}$=1.7367 (e.g., for the Z, X, and Y axis, respectively), the $\beta$-B$_a$B$_2$O$_2$ crystal may have an index of refraction of $n_o$=1.6551 (e.g., for the z axis) and $n_e$=1.5425 (e.g., for the X or Y axis), and the L$_i$B$_3$O$_5$ crystal may have an index of refraction of $n_{z=c}$=1.6055, $n_{x=a}$=1.5656, and $n_{y=b}$=1.5905 (e.g., for the Z, X, and Y axis, respectively).

As an example, tunable lens 604 may represent a ball lens made of the $\beta$-B$_a$B$_2$O$_2$ crystal. By rotating tunable lens 604, the index of refraction may be varied along the optical axis. For example, tunable lens 604 may be situated to provide an index of refraction of $n_e$=1.5425 (e.g., along its optical Y axis) to provide one level of magnification within a zoom lens. Tunable lens 604 may then be rotated to provide an index of refraction of $n_o$=1.6551 (e.g., along its optical Z axis) to provide a different level of magnification. Further details regarding tunable lenses (e.g., tunable lenses 500 and 600) and lens systems and methods may be found in U.S. Pat. No. 6,898,021 issued May 24, 2005, which is incorporated herein by reference in its entirety.

Figure 10:
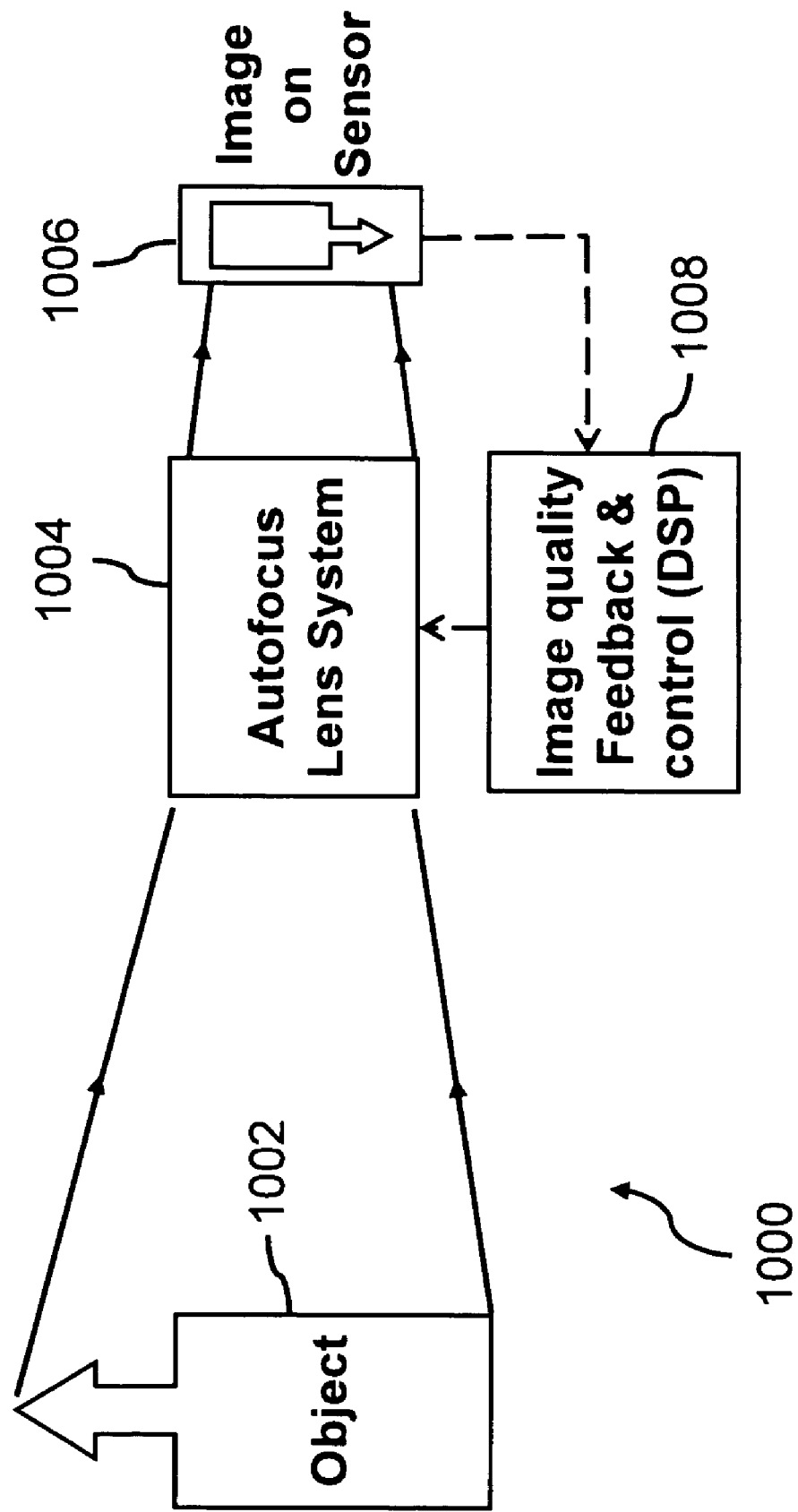
FIG. 10 illustrates an autofocus system in accordance with an embodiment of the present invention.

As discussed herein, a lens may include a tunable lens (e.g., tunable lens 500 or tunable lens 600) to provide autofocus functionality. The autofocus function may be provided, for example, via a feedback control system. For example, FIG. 10 illustrates an autofocus system 1000 in accordance with an embodiment of the present invention.

Autofocus system 1000 includes a lens 1004, a sensor 1006, and a feedback control system 1008. Lens 1004 may represent a group of lens elements (e.g., as described in reference to FIGS. 1-4b and 7-9) having at least one tunable lens. Control system 1008 (e.g., a digital signal processor or other conventional type of image quality processing system) monitors the image on sensor 1006 (e.g., a CCD, a CMOS, or other conventional type of image sensor) and adjusts the one or more tunable lenses within lens 1004 to optimize the focus of the image (e.g., of an object 1002) on sensor 1006.

In general, the systems and methods for providing zoom and/or autofocus lenses may be implemented in a variety of applications. For example, one or more lenses may be implemented within a camera (e.g., a digital camera, a security camera, or a camera incorporated into a cell phone or other portable electronic device). As another example, one or more lenses may be implemented within an optical reader and/or writer system (e.g., a CD or a DVD player, a CD or a DVD recorder, and/or a CD or a DVD rewritable system using single or multiple laser beams) or a projection system (e.g., a miniature image projection lens system).

Figure 11:
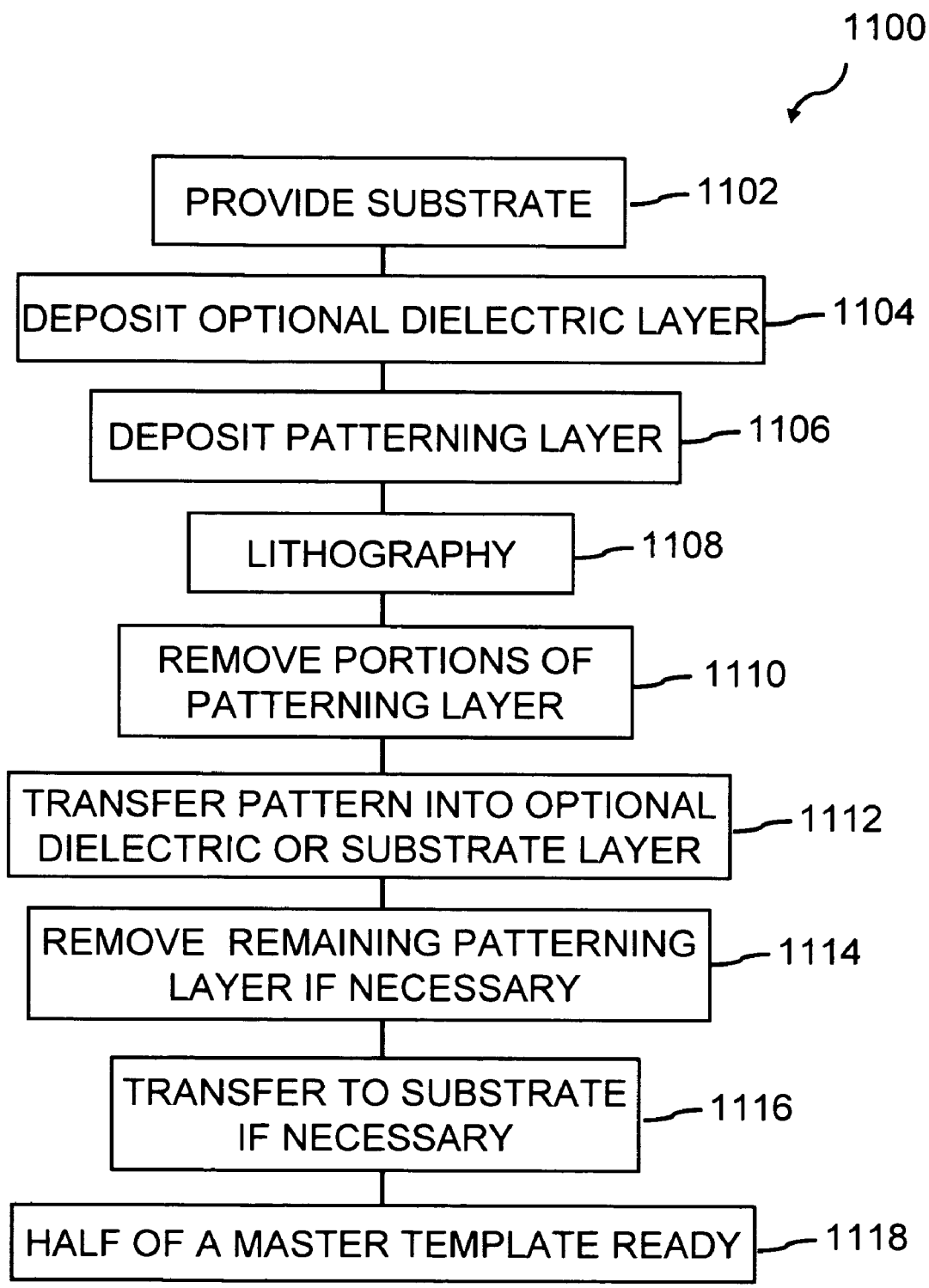
FIG. 11 is a flow chart showing a process for fabricating a half-master template for glass molding and/or plastic molding of lenses in accordance with one or more embodiments of the present invention.

FIG. 11 is a flowchart illustrating a method 1100 in accordance with an embodiment of the present invention for fabricating a lens/microlens, a lens/microlens array, and/or a spherical/non-spherical lens master template. A substrate is first provided in step 1102. An optional dielectric layer is then deposited on the substrate in step 1104. A patterning layer, such as a spin-on photoresist or other photosensitive material, is deposited on the dielectric layer in step 1106. Selected portions of the patterning layer are defined, such as by conventional photolithography processing, in step 1108. The removed portions of the patterning layer expose areas of the dielectric layer (or substrate if dielectric layer is not present), where the shapes of the lenses/microlenses are formed in step 1110.

In step 1112, the shapes corresponding to the exposed portions of the dielectric layer (and/or substrate layer) are selectively etched and transferred, such as with a wet etch, a dry etch, a grey scale mask, or a shadow mask, to form controlled curved recesses. The curved recesses can be deepest in the center and taper up toward the sides or circumference, or as designed, depending on the application. The etching can transfer the recessed shapes into the optional dielectric material or right through to the substrate material. The remaining portions of the patterning layer are removed in step 1114, and the resulting template is ready for further processing steps or can be used for plastic molding of specially designed lenses. Furthermore, the curved recesses can be any suitable shape, such as semi-spherical or non-spherical, depending on the application.

If necessary, the dielectric template formed in step 1114 may be further transferred into the substrate in step 1116 for glass molding. The substrate materials used for the master templates of glass molding of lenses should be very hard materials (e.g., SiC and the like), so as to not deform during the entire process of glass molding or plastic molding of the lenses. The final master template 1118 is then ready to be used, although it may be further processed, such as the deposition of a protecting layer of hardened dielectric layer over the recessed template after step 1116.

Figure 12A:
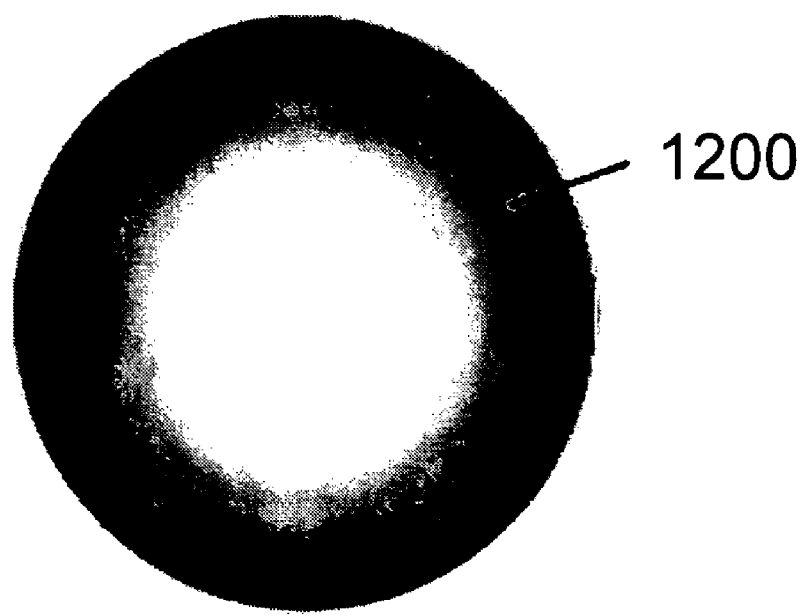
FIGS. 12a and 12b show an exemplary grey scale mask and a characteristic of a grey scale mask, respectively, in accordance with an embodiment of the present invention.
Figure 12B:
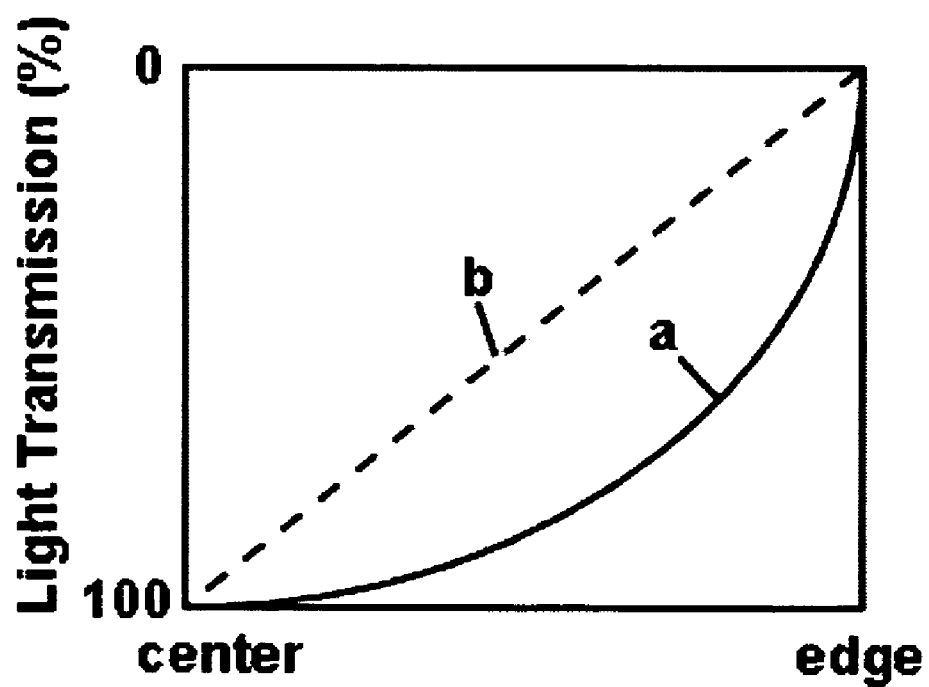

FIGS. 12a and 12b and 13a-13c show a method of forming controlled curved recesses using an exemplary grey scale mask process in accordance with one or more embodiments of the present invention. FIG. 12a shows an example of one opening 1200 of a grey scale mask, where a typical grey scale mask will have many such openings 1200 separated by opaque sections in between. A grey scale mask lets different amounts of light through different radius locations of the opening, such as shown in FIG. 12b. The degree of grey at different radii of the opening 1200 on the grey scale mask determines the degree of light exposure at corresponding locations of the underlying photosensitive dielectric such as photoresist.

As shown, less light passes through while transitioning radially outward from the center of the opening, from a maximum of approximately 100% at the center to approximately 0% at the edge or outer circumference (e.g., as illustrated in FIGS. 12a and 12b). The light transmission curve "a" can be any suitable shape for forming the desired microlens or lens.

Figure 13B:
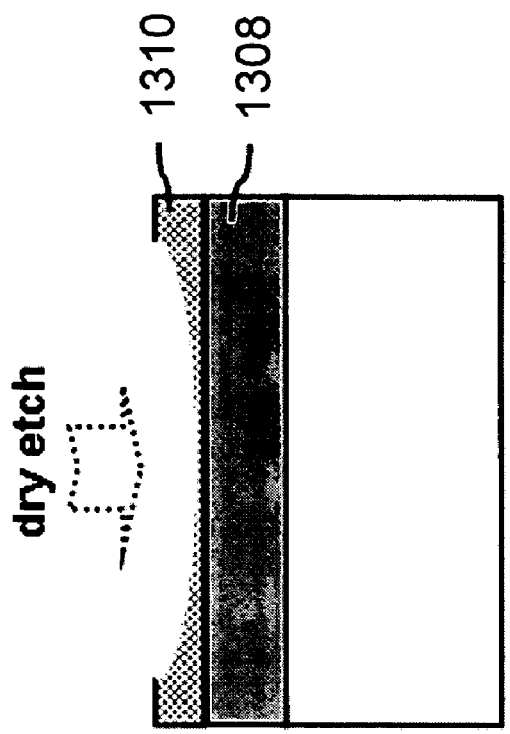
FIGS. 13a-13c show various stages of a process for forming controlled curvature recesses using a grey scale mask in accordance with an embodiment of the present invention.
Figure 13C:
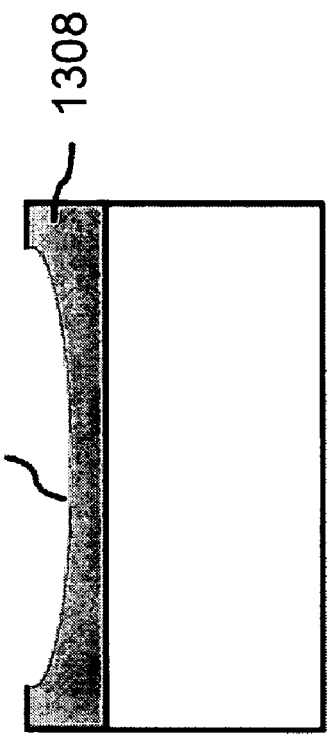
Figure 13A:
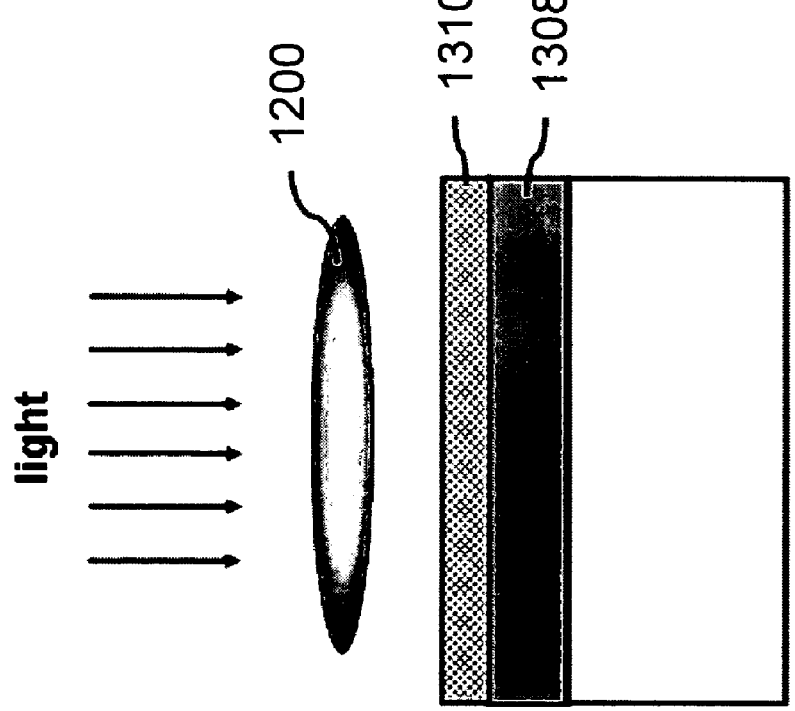

FIGS. 13a-13c show a sequence of steps using an exemplary grey scale mask (e.g., the mask of FIG. 12a) to form the controlled curved recesses. In FIG. 13a, a small portion of patterning layer 1310 (such as a positive photoresist) is exposed through one opening 1200 of a grey scale mask. Patterning layer 1310 is developed and a dry etch is performed to transfer the exposed pattern to underlying dielectric layer 1308, as shown in FIGS. 13b and 13c, to form curved recesses 1314. Thus, by controlling the scale of the grey on the grey scale mask and dry etch, both spherical and non-spherical microlenses and lenses of different designs can be formed quickly and inexpensively.

Depending on the type of grey scale mask design, patterning and etch, curved recesses 1314 may have different shapes which can be used to form spherical, non-spherical, convex, concave, or confocal lens shapes or any other shape or desired combination of shapes. Additionally, curved recesses 1314 may also be treated to smooth out irregularities on the surface of the curved recesses. The "roughness" of the curved recesses should be small compared to the wavelength of the visible light.

For example, in accordance with one embodiment, the roughness should be approximately 1/10 or less of the wavelength of the visible light. "Roughness" as defined herein refers to the distance or variation between peaks and troughs on the surface of the curved recesses. As an example, when using dry etch to form curved recesses 1314, a quick wet etch or wash may be added to smooth out any roughness of the surface of curved recesses 1314. An alternative to the quick wet etch is to coat the surface of curved recesses 1314 with hardened dielectric material. Other suitable methods to smooth out the surface areas of the recesses 1314 include those such as properly designed chemical mechanical polishing (CMP) and the like.

After forming curved recesses 1314 of dielectric layer 1308 or substrate (and polished if necessary), the structure can be used as a template for making glass or plastic lenses through glass molding or plastic molding, or to continue further processing for forming individual lenses or arrays of individual lenses using semiconductor processing. For either glass molding or plastic molding of lenses, multiple templates of the same pattern design and curved shapes or different designs and shapes may be used depending on specific applications.

Figure 14A:
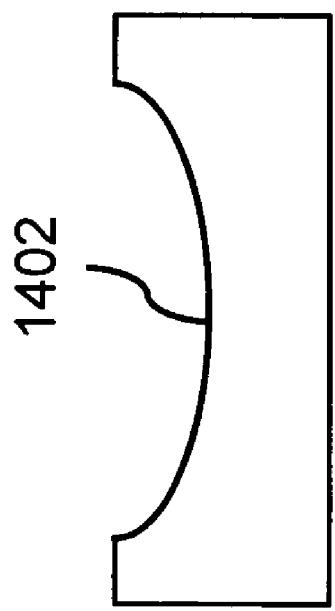
FIGS. 14a and 14b are exemplary half-master templates for use in plastic molding and/or glass molding of lenses in accordance with one or more embodiments of the present invention.
Figure 14B:
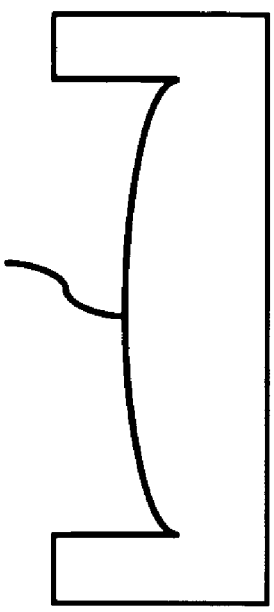

FIGS. 14a and 14b show two exemplary half-master templates of different shapes 1402 and 1404, which may be used for glass or plastic molding of various lenses or microlenses in accordance with one or more embodiments of the present invention. Template shapes 1402 and 1404 may be part of an array of lens master templates. The mixed use of these master templates, such as template shapes 1402 and 1404, can be used to mold lenses or microlenses of any shapes including but not limited to spherical, non-spherical, convex, concave, or confocal lens shapes or any other shape or desired combination of shapes. The substrate materials used for these master templates should be very hard materials (e.g., SiC and the like), so as to not deform during the entire process of glass molding or plastic molding of the lenses.

One or more embodiments of the present invention allow a microlens or lens array or individual lens having spherical, non-spherical or different sized/shaped microlenses/lens to be manufactured easily. In conventional processes for making non-spherical or specially sized or shaped lenses, the lenses are typically shaped and polished manually and sometimes individually, which can be costly in terms of time and effort.

On the other hand, spherical lens arrays can be manufactured quickly by using conventional machines. However, the machines do not allow non-spherical lenses to be formed nor do they allow lenses of different shapes or sizes to be formed on the same array. Advantageously, one or more embodiments of the present invention allows microlens arrays or array of lenses or lenses having non-spherical microlenses or lenses of different shapes or sizes to be made quickly and inexpensively, which can then be used in one or more embodiments of the present invention. Further details regarding lenses and methods of making the lenses may be found in U.S. patent application Ser. No. 10/797,809 entitled "Lens Array and Method of Making Same" filed Mar. 9, 2004, which is incorporated herein by reference in its entirety.

Embodiments described above illustrate but do not limit the invention. It should also be understood that numerous modifications and variations are possible in accordance with the principles of the present invention. Accordingly, the scope of the invention is defined only by the following claims.

I claim:

1. An autofocus camera lens system comprising:
   a first lens comprised of a nematic liquid crystal and adapted to provide a variable index of refraction, wherein the first lens comprises a single, uniform lens;
   a second and a third lens, wherein the first lens, the second lens, and the third lens are situated in fixed positions to provide a focal length for the lens system, with a variable focus based on the index of refraction of the first lens; and
   a control system adapted to monitor an image received through the first lens, the second lens, and the third lens and adjust the focus via the index of refraction of the first lens;
   wherein the second lens comprises a nematic liquid crystal adapted to provide a variable index of refraction, with the focal length variable based on the index of refraction of the second lens, with the control system further adapted to monitor an image received through the first lens, the second lens, and the third lens and adjust the focal length via the index of refraction of the second lens.

2. The system of claim 1, wherein the first lens is a tunable field lens, the second lens is an objective lens, and the third lens is an image lens.

3. The system of claim 1, wherein the first lens is a tunable image lens, the second lens is an objective lens, and the third lens is a field lens.

4. The system of claim 1, wherein the focus is varied by varying a direct current and/or alternating current voltage level provided to the first lens, which varies the index of refraction of the first lens over a continuous range of values for the focus.

5. The system of claim 4, wherein the first lens further comprises conductors for providing the voltage level to the nematic liquid crystal.

6. The system of claim 1, wherein the first lens further comprises at least one substrate comprised of a glass or a plastic.

7. The system of claim 6, wherein the substrate is formed by at least one of a diffusion, a deposition, a spin-on polymer, and a lithographic patterning technique.

8. The system of claim 1, wherein the first lens further comprises at least one layer of an initial liquid crystal molecular alignment assistant material.

9. The system of claim 1, wherein the first lens and the second lens provide focus and zoom functions, respectively, for the system.

10. The system of claim 1, wherein the system forms part of at least one of a camera, a personal digital assistant, a telephone, a CD device, a DVD device, an optical disk drive, or an image projector.

11. The lens of claim 1, wherein the first lens further comprises:
    a first fixed lens coupled to a first surface of the first lens;
    a second fixed lens coupled to a second surface of the first lens; and
        wherein the first surface is not parallel to the second surface, with the first surface matching a contour of the first fixed lens and the second surface matching a contour of the second fixed lens.

12. A lens comprising:
    a first lens adapted to provide a variable index of refraction, wherein the first lens comprises a non-linear crystal; and
    a second lens, wherein the first lens and the second lens are situated in fixed positions to provide a focal length for the lens, with a variable focus based on the index of refraction of the first lens, and wherein the focus is varied by rotating the first lens, which varies the index of refraction of the first lens.

13. The lens of claim 12, wherein the first lens has a different index of refraction along different optical axes.

14. The lens of claim 13, wherein the non-linear crystal comprises at least one of a KDP crystal, a KTP crystal, a $\beta\text{-}B_aB_2O_2$ crystal, and an $L_iB_3O_5$ crystal.

15. The lens of claim 12, wherein the lens is incorporated within an autofocus optical system having a control system adapted to monitor an image received through the lens and adjust the focus via the index of refraction of the first lens.

16. The lens of claim 12, further comprising a third lens, and wherein the first, second, and third lens function to provide a field lens, an objective lens, and an image lens for the lens.

17. The lens of claim 12, wherein the lens is incorporated into at least one of a camera, a personal digital assistant, a telephone, a CD device, a DVD device, an optical disk drive, and an image projector.

18. An optical device comprising:
a first lens having a variable index of refraction, wherein the first lens comprises a nematic liquid crystal material forming a single, uniform lens;
a second lens and a third lens situated in fixed positions relative to the first lens such that light passes through the first lens, the second lens, and the third lens of the optical device;
means for varying the index of refraction of the first lens to vary a focus of the optical device; and
means for automatically adjusting the focus via the index of refraction of the first lens;
wherein the first lens further comprises:
a first fixed lens coupled to a first surface of the first lens;
a second fixed lens coupled to a second surface of the first lens; and
wherein the first surface is not parallel to the second surface, with the first surface matching a contour of the first fixed lens and the second surface matching a contour of the second fixed lens.

19. The optical device of claim 18, wherein the optical device comprises at least one of a camera, a personal digital assistant, a telephone, a CD device, a DVD device, an optical disk drive, or an image projector.

20. The optical device of claim 18, wherein the second lens has a variable index of refraction, and the optical device further comprises means for varying the index of refraction of the second lens to vary a focal length of the optical device.

21. The optical device of claim 18, wherein the first lens further comprises at least one layer of an initial liquid crystal molecular alignment assistant material.

22. The optical device of claim 18, wherein the first lens further comprises at least one substrate comprised of a glass or a plastic.

23. A method of varying a focus of a motionless autofocus camera lens system, the method comprising:
providing a first lens having a variable index of refraction, wherein the first lens comprises a single, uniform lens;
providing at least a second lens disposed at a corresponding fixed distance from the first lens, wherein the second lens has a variable index of refraction;
varying the index of refraction of the first lens to adjust the focus of the motionless autofocus camera lens system;
varying the index of refraction of the second lens to adjust a focal length of the motionless autofocus camera lens system;
monitoring an image received through the motionless autofocus camera lens system; and
performing automatically the varying based on the monitoring.

24. The method of claim 23, wherein the first lens comprises a nematic liquid crystal material.

25. The method of claim 23, wherein the first lens comprises a nonlinear crystal.

26. The method of claim 23, wherein the varying of the index of refraction of the first lens is performed by rotating the first lens.

27. A lens comprising:
a first lens comprised of a nematic liquid crystal and adapted to provide a variable index of refraction, wherein the first lens comprises a single, uniform lens; and
a second and a third lens, wherein the first lens, the second lens, and the third lens are situated in fixed positions to provide a focal length for the lens, with a variable focus based on the index of refraction of the first lens;
wherein the first lens further comprises:
a first fixed lens coupled to a first surface of the first lens;
a second fixed lens coupled to a second surface of the first lens; and
wherein the first surface is not parallel to the second surface, with the first surface matching a contour of the first fixed lens and the second surface matching a contour of the second fixed lens.

28. The lens of claim 27, wherein the first lens is a tunable field lens, the second lens is an objective lens, and the third lens is an image lens.

29. The lens of claim 27, wherein the first lens is a tunable image lens, the second lens is an objective lens, and the third lens is a field lens.

30. The lens of claim 27, wherein the focus is varied by varying a direct current and/or alternating current voltage level provided to the first lens, which varies the index of refraction of the first lens over a continuous range of values for the focus.

31. The lens of claim 30, wherein the first lens further comprises conductors for providing the voltage level to the nematic liquid crystal.

32. The lens of claim 27, wherein the first lens further comprises at least one substrate comprised of a glass or a plastic.

33. The lens of claim 32, wherein the substrate is formed by at least one of a diffusion, a deposition, a spin-on polymer, and a lithographic patterning technique.

34. The lens of claim 27, wherein the first lens further comprises at least one layer of an initial liquid crystal molecular alignment assistant material.

35. The lens of claim 27, wherein the second lens comprises a nematic liquid crystal adapted to provide a variable index of refraction, with the focal length variable based on the index of refraction of the second lens.

36. The lens of claim 35, wherein the focal length is variable based on the index of refraction of the second lens, with the first lens and the second lens providing focus and zoom functions, respectively, for the lens.

37. The lens of claim 27, wherein the lens is incorporated within an autofocus optical system having a control system adapted to monitor an image received through the lens and adjust the focus via the index of refraction of the first lens.

38. The lens of claim 37, wherein the lens is incorporated into at least one of a camera, a personal digital assistant, a telephone, a CD device, a DVD device, an optical disk drive, or an image projector.

39. The lens of claim 37, wherein the second lens comprises a nematic liquid crystal adapted to provide a variable index of refraction, with the focal length variable based on the index of refraction of the second lens, and wherein the control system is further adapted to monitor an image received through the lens and adjust the focal length via the index of refraction of the second lens.

* * * * *